(12) United States Patent
Fukuda

(10) Patent No.: US 8,902,610 B2
(45) Date of Patent: Dec. 2, 2014

(54) ELECTRONIC DEVICE

(75) Inventor: Minoru Fukuda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 392 days.

(21) Appl. No.: 13/540,618

(22) Filed: Jul. 3, 2012

(65) Prior Publication Data

US 2013/0010438 A1 Jan. 10, 2013

(30) Foreign Application Priority Data

Jul. 5, 2011 (JP) .................................. 2011-149167
Apr. 19, 2012 (JP) .................................. 2012-095431

(51) Int. Cl.
*H05K 7/02* (2006.01)
*H05K 7/04* (2006.01)
*H05K 5/00* (2006.01)
*H05K 7/00* (2006.01)
*H05K 1/18* (2006.01)
*H01F 27/32* (2006.01)
*H05K 3/30* (2006.01)

(52) U.S. Cl.
CPC .................................. *H05K 5/0095* (2013.01)

USPC ........... 361/807; 361/809; 361/810; 361/748; 361/752; 174/138 E; 174/138 G

(58) Field of Classification Search
USPC ......... 361/748, 752, 759, 801, 803, 804, 807, 361/809, 810; 174/138 E, 138 G; 439/327, 439/328

See application file for complete search history.

(56) References Cited

FOREIGN PATENT DOCUMENTS

| JP | 06-079185 | 11/1994 |
|---|---|---|
| JP | 10-041665 | 2/1998 |
| JP | 2000-165177 | 6/2000 |

*Primary Examiner* — Hoa C Nguyen
*Assistant Examiner* — Binh Tran
(74) *Attorney, Agent, or Firm* — Jianq Chyun IP Office

(57) ABSTRACT

An electronic device is provided. In the electronic device, a cover is securely fitted to a predetermined positioning hole formed in a printed board using a ready-made cover without using solder when the cover is installed in the printed board, so that the cover is prevented slipping from the printed board. The positioning hole is formed in a predetermined position of the printed board, and a cover claw that can be fitted to the positioning hole of the cover is formed in the cover, so that the cover covers the principal surface of the printed board to provide an electronic device.

5 Claims, 8 Drawing Sheets

ELECTRONIC DEVICE

CROSS REFERENCE TO RELATED APPLICATIONS

This application claims the priority benefit of Japan application serial no. 2011-149167, filed on Jul. 5, 2011, and Japan application serial no. 2012-095431, filed on Apr. 19, 2012. The entirety of each of the above-mentioned patent applications is hereby incorporated by reference herein and made a part of this specification.

TECHNICAL FIELD

The present invention relates to an electronic device, and more particularly, to an electronic device capable of installing a cover in the printed board where circuit components are mounted without soldering, if any, and capable of easily performing the installation even using a lead-free solder.

BACKGROUND DISCUSSION

In the prior art, an electronic device, for example, a surface-mount crystal oscillator is configured by mounting a crystal resonator 13 and circuit components 14 on a principal surface of a base board 10 and covering the base board 10 with a metal cover 9 from the upside as shown in FIG. 9.

Here, in order to install the metal cover 9 in the base board 10, protrusions 11 are provided on the side surface of the metal cover 9, and bulging portions (claw) 12 extend downwardly from the protrusions 11. In addition, the protrusions 11 abut on the outer circumferential surface of the base board 10, and the bulging portions 12 extending downwardly from the protrusions 11 are inserted into the notches 18 formed on the side surface of the base board 10, so that the metal cover 9 is elastically retained in the side surfaces of the base board 10 as shown in FIG. 10, and, the metal cover 9 and the base board 10 are fixed by soldering (See Japanese Patent Laid-Open Publication No. 2000-165177, hereinafter referred to as Reference 1).

In this regard, in the prior art, as an example of the claw for engaging/securing the metal cover 9 with the base board 10, there has been proposed a technique in which a fitting claw 12a is formed in the cover 9 in a substantially L-shaped bent and widened to the outer side and is fitted and locked to the fitting trench 18a formed in the base board 10 as shown in FIG. 11A. Alternatively, as shown in FIG. 11B, a substantially L-shaped bend portion having elasticity is formed in a center portion of the fitting claw 12b formed in the cover 9, the fitting claw 12b is inserted into the fitting hole 18b formed in the base board 10, so that the cover 9 is locked to the base board 10. Alternatively, as shown in FIG. 11C, the fitting claw 12c formed in the cover 9 is configured in a Y-bend shape having a gap g in its center so as to provide elasticity in an outwardly widened direction, so that the cover 9 is locked to the base board 10 (See Japanese Utility Model Laid-Open Publication No. 6-79185, hereinafter referred to as Reference 2).

However, in such a type of electronic device, for example, a crystal oscillator, after the fitting claw provided in the cover is inserted into the fitting hole provided in the base board, the cover is fixed to the mount board by soldering the peripheral of the cover. For this reason, it is difficult to obtain a perfectly lead-free device. In addition, the solder used to fix the cover may be re-molten during a reflow work when a user mounts the device on the mount board, so that the cover may slip from the base board.

In addition, in order to achieve perfect engagement/securing between the cover and the printed (base) board, it is necessary to change a design of the shape of the fitting claw provided in the cover and the like to match the printed board to be engaged/secured. Therefore, it is significantly difficult to commonly use the ready-made cover in various types of printed boards.

SUMMARY OF THE INVENTION

In the electronic device disclosed herein, in order to prevent the cover slipping from the printed board during a reflow (soldering) work when a user mounts the electronic device on the mount board, thus, a need exists for an electronic device capable of engaging/securing the cover to the positioning hole appropriately formed in the printed board without using a lead-containing high-temperature solder and without changing a design of the ready-made cover.

According to an aspect of the present invention, there is provided an electronic device including: a positioning hole formed in a predetermined position of a printed board; and a cover that has a cover claw fitted to the positioning hole and covers a principal surface of the printed board, wherein at least two positioning holes are formed in the vicinity of a first end surface of the printed board, at least one positioning hole is formed in the vicinity of a second end surface of the printed board, one of at least the two positioning holes formed in the vicinity of the first end surface is deviated by a predetermined dimension in parallel along a vertical center line with respect to the first end surface, at least two cover claws are formed in parallel with a first end surface of the cover, at least one cover claw is formed in a center position of the second end surface of the cover, at least the two cover claws are fitted to the corresponding positioning holes formed in the first end surface of the printed board, the cover claw formed in the second end surface of the cover is fitted to the positioning hole formed in the vicinity of the second end surface of the printed board by twisting the cover to form a stop portion in a side surface of the cover, so that the cover is firmly secured to the printed board.

In the electronic device of the present invention, a shape of the positioning hole formed in the first end surface of the printed board can be a circle shape as seen in a plan view, and a shape of the positioning hole formed in the second end surface of the printed board can be an elliptical shape as seen in a plan view.

In the electronic device of the present invention, in a side surface of the cover positioned to match at least the two positioning holes formed in the vicinity of the first end surface of the printed board, the cover can be fitted to the positioning hole formed in the vicinity of the first end surface of the printed board and then is rotated, and a stop portion can be formed in the side surface of the cover by twisting the cover when the cover is fitted to the printed board, so that the fitted cover claw is prevented slipping from at least two positioning holes.

In the electronic device of the present invention, at least the two positioning holes are formed in a reverse-tapered shape toward a bottom face of the printed board, and side surfaces of at least the two cover claws have an acute angle with respect to a principal surface of the printed board.

In the electronic device of the present invention, a constricted portion is formed in an elementary part of at least the two cover claws adjoining the printed board.

It is possible to commonly use the ready-made cover just by forming a predetermined positioning hole in the printed board and secure the cover to the printed board without soldering. Even when the solder is re-molten to mount the electronic device on the mount board during the reflow work in a user side, it is possible to prevent the cover slipping from the printed board. Furthermore, it is possible to implement a perfectly lead-free soldering.

BRIEF DESCRIPTION OF THE DRAWINGS

FIGS. 11A, 11B, and 11C are partially enlarged views illustrating exemplary configurations for securing the metal cover to the base board in the crystal oscillator of FIGS. 9 and 10 in the prior art, in which FIG. 11A illustrates an example of fitting the fitting claw provided in the metal cover to the fitting hole of the base board, FIG. 11B illustrates an example of forming a substantially L-shaped bend portion having elasticity in the center of the fitting claw, and FIG. 11C illustrates an example of forming the fitting claw in a Y-bend shape to provide elasticity in an outwardly widened direction for securing.

DETAILED DESCRIPTIONS OF THE PREFERRED EMBODIMENTS

Hereinafter, an electronic device according to an embodiment of the present invention will be described with reference to the accompanying drawings.

Figures 1A, 1B:
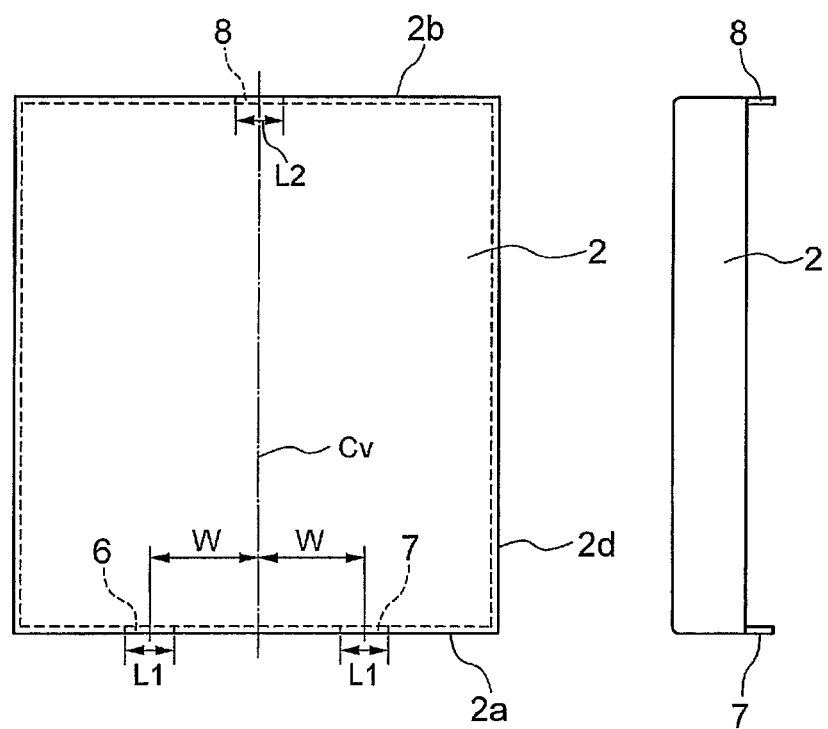
FIG. 1A is a plan view illustrating a cover used in an electronic device disclosed herein as seen from the cover surface side.
FIG. 1B is a side view illustrating the cover used in the electronic device disclosed herein.

As shown in FIG. 1, an electronic device disclosed herein, such as an oscillator, is obtained by mounting components such as an IC circuit or a crystal resonator on the printed board 1 and then covering a metal cover. Similar to the metal cover ready-made, a cover 2 is formed of a metal material such as Kovar and configured to have a rectangular shape as seen in a plan view with a concaved cross-sectional shape slightly smaller than that of the printed board described below in length and width dimensions. The cover claws 6, 7, and 8 erected from the cover surface are formed on the first and second end surfaces 2a and 2b in a long side direction through a press work along with the metal cover 2.

Here, as shown in FIG. 1, the first end surface 2a of the cover 2 is provided with at least two erect cover claws 6 and 7 separated with an equal interval (distance) W from the vertical center line $C_V$ of the cover 2, and the opposite second end surface 2b of the cover 2 is provided with at least one erect cover claw 8 on the vertical center line $C_V$. In particular, the width-directional positions and the dimensions of the cover claws 6 and 7 provided in the first end surface 2a are set to have the same interval W and are set to be slightly smaller than the radial dimension $D_1$ of the holes 3 and 4 ($L_1 < D_1$) so as to fit them in the positioning holes 3 and 4, which is circular as seen in a plan view, formed in the vicinity of the first end surface 1a of the printed board 1 described below. In addition, the cover claw 8 is erected on the surface of the cover 2 and is simultaneously bent inwardly when the metal plate is punched during a press work of the cover 2 such that the cover claw 8 provided in the second end surface 2b has a size slightly smaller than the width-directional dimension $D_2$ of the hole 5 ($L_2 < D_2$) so as to be fitted to the positioning hole 5, which is, for example, elliptical as seen in a plan view, formed in the vicinity of the second end surface 1b of the printed board 1.

Figure 2:
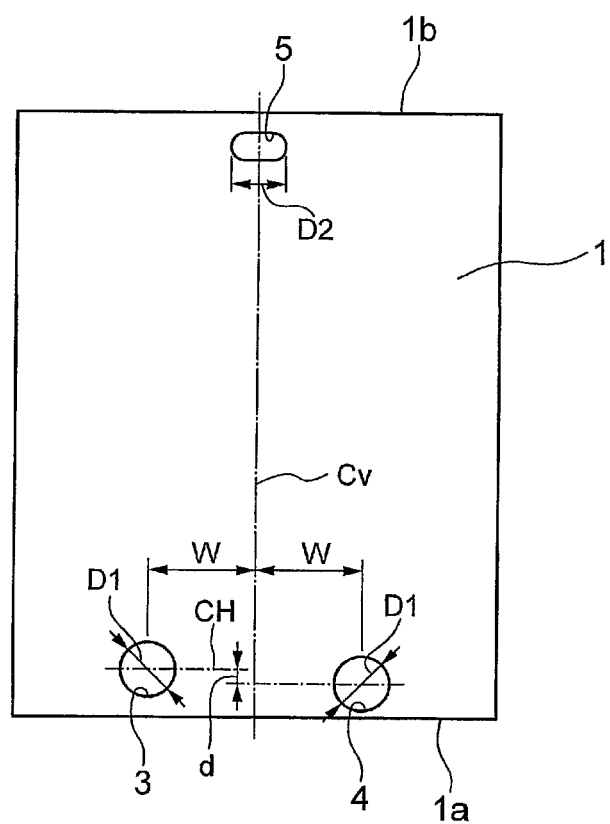
FIG. 2 is a plan view illustrating a printed board engaged with and covered by the cover of FIGS. 1A and 1B.

The printed board 1 covered by the cover 2 after the circuit components and the like are mounted is formed of glass epoxy resin and the like. As shown in FIG. 2, the printed board 1 has a vertical dimension slightly larger than that of the metal cover 2 described above such that the positioning holes 3, 4, and 5 where the cover claws 6, 7, and 8 are fitted can be formed on the printed board 1.

In particular, according to an embodiment described herein, as shown in FIG. 2, positioning holes 3 and 4 are formed in the vicinity of the first end surface 1a of the printed board 1 with an equal interval W in a width direction from the vertical center line $C_V$ of the printed board 1 while, from the horizontal center line $C_H$ of one of the positioning holes 3, the other positioning hole 4 is deviated by a dimension d downwardly along the vertical center line in a parallel direction. In addition, in the vicinity of the second end surface 1b of the printed board 1, for example, a single positioning hole 5 is formed on the vertical center line $C_V$ so as to have a width-directional dimension $D_2$ and at least an elliptical shape as seen in a plan view.

As shown in FIG. 2, in the cover 2 used in the electronic device according to an embodiment disclosed herein, the positioning holes 3, 4, and 5 of the cover 2 are formed in the vicinity of both the vertical end surfaces 1a and 1b of the circuit board 1. In addition, the cover claws 6, 7, and 8 are formed in the cover 2 such that their forming positions match the positioning holes 3, 4, and 5, respectively, so that they can be securely fitted to the positioning holes 3, 4, and 5, respectively.

In particular, in the electronic device according to an embodiment disclosed herein, as shown in FIG. 2, out of at least two positioning holes 3 and 4 formed in the vicinity of the first end surface 1a of the printed board 1, a horizontal position of one positioning hole 4 is deviated by a distance d from a horizontal position of the other positioning hole 3 along the vertical center line $C_V$. In addition, at least one positioning hole 5 is formed in the vicinity of the second end surface 1b opposite to the first end surface 1a. In addition, at least two cover claws 6 and 7 formed in the first end surface 2a of the cover 2 are fitted to the positioning holes 3 and 4, respectively, and at least one cover claw 8 formed in the second end surface 2b of the cover 2b is fitted to the positioning hole 5, so that the cover 2 is installed to cover the mounting surface of the circuit components and the like of the printed board 1 from the upside to provide an electronic device.

Here, as shown in FIG. 2, at least two positioning holes 3 and 4 formed in the first end surface 1a side of the printed board 1 are deviated from each other by a predetermined dimension d in a direction parallel to the first end surface 1a along the vertical center line $C_V$. Therefore, as indicated by a virtual line of FIG. 3, in order to install the cover 2 in the printed board, first, the cover claws 6 and 7 for securing the cover 2 is inserted into the positioning holes 3 and 4, in one side respectively, (See FIG. 4), and the cover claw 8 is inserted into the other positioning hole 5 by twisting cover 2 in an arrow direction of FIG. 3 (See FIG. 5). Then, the cover 2 is secured to the printed board 1 as indicated by a solid line by further slightly rotating the cover 2 after the insertion (See FIG. 3).

Figure 3:
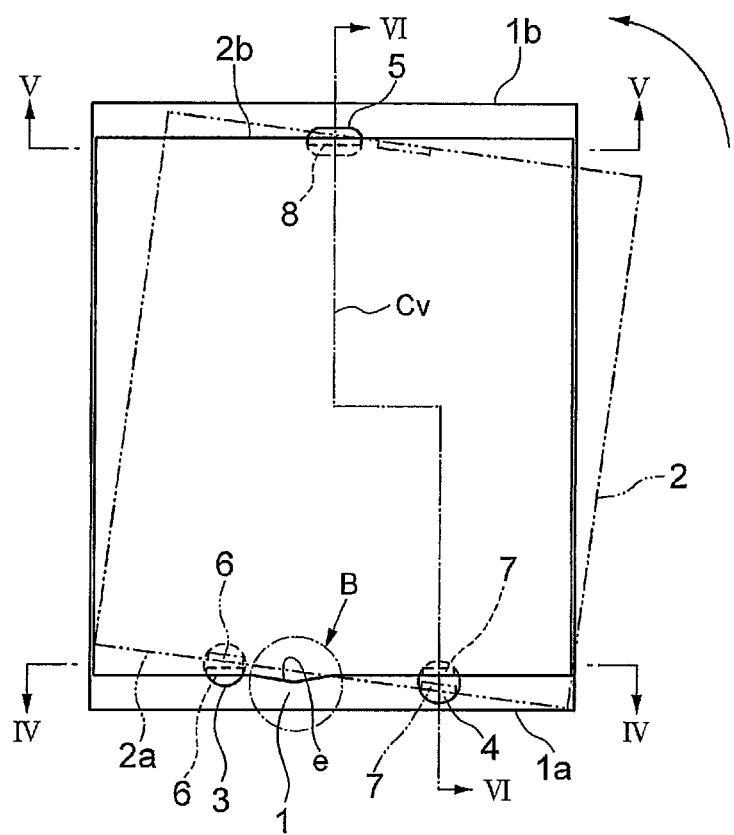
FIG. 3 is a plan view illustrating the electronic device for describing a sequence of securing the cover used in the electronic device disclosed herein to the printed board where circuit components and the like are mounted, as seen from a surface direction of the cover (where circuit components mounted on the printed board are not illustrated for clarity purposes).

When the cover claw 8 is inserted into the positioning hole 5, the side surface 2c of the cover 2 in the arrow portion B of FIG. 3 is elastically deformed. A so-called stop portion "e" protrudes on the side surface 2d of the cover 2 (See FIGS. 8A and 8B), so that the stop portion "e" has a spring effect. For this reason, the cover 3 is firmly secured to the printed board 1, so that it is possible to prevent the cover 2 slipping from the printed board 1 without soldering. Here, the cover 2 can be fixed to the printed board 1 by soldering using a typical lead-free solder after the cover 2 is secured to the printed board 1.

Figure 7A:
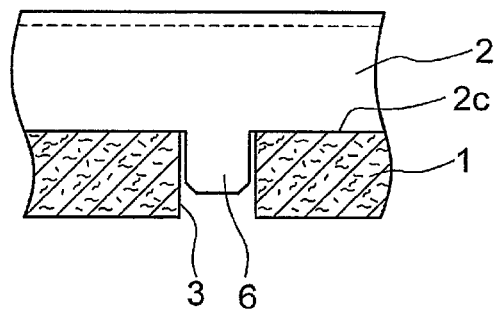
FIG. 7A is a partially enlarged view illustrating the arrow portion A of FIGS. 4 and 5 for describing an embodiment in which the base of the cover claw is cut perpendicularly thereto.
Figure 7B:
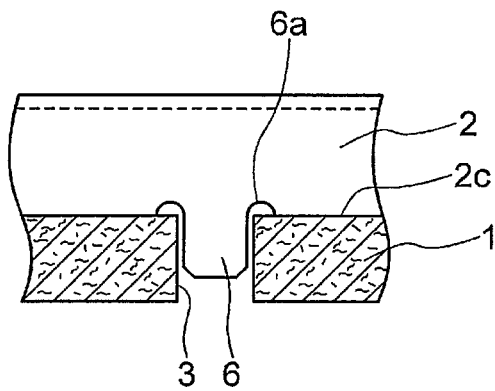
FIG. 7B is a partially enlarged view illustrating the arrow portion A of FIGS. 4 and 5 for describing an embodiment in which a constriction is formed in the base of the cover claw.

Typically, the cover claws 6, 7, and 8 are formed by perpendicularly cutting out the contact surface with the printed board 1 from the main body of the cover 2 and bending it as shown in FIG. 7A. However, as shown in FIG. 7B, a constricted trench 6a can be formed in the cutout portion to provide elasticity in the cover claw 6 and facilitate insertion to the positioning hole 3.

Figure 8A:
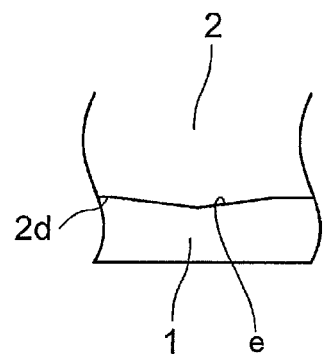
FIG. 8A is a partially enlarged plan view illustrating the arrow portion A of FIGS. 3 and 6 for describing a cover-securing stop portion formed in the side surface of the cover when the cover claw is fitted to the positioning hole by twisting the cover.
Figure 8B:
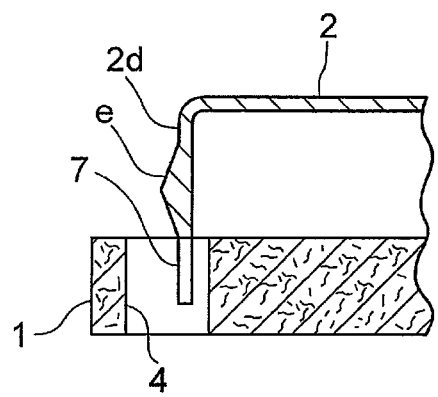
FIG. 8B is a partially enlarged cross-sectional view illustrating the arrow portion B of FIGS. 3 and 6 for describing a cover-securing stop portion formed in the side surface of the cover when the cover claw is fitted to the positioning hole by twisting the cover.
Figure 9:
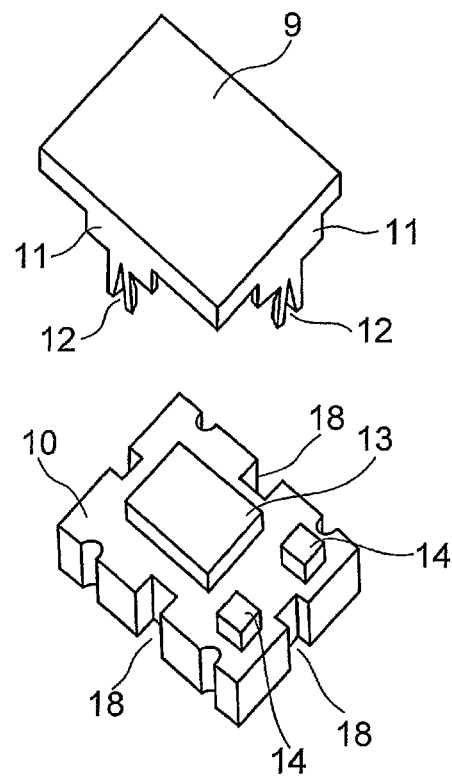
FIG. 9 is an exploded view illustrating an electronic device in the prior art, for example, a surface-mount crystal oscillator by exploding main parts thereof into a metal cover, a mounted resonator, and a base board.
Figure 10:
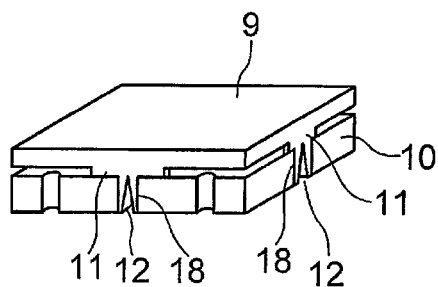
FIG. 10 is an assembly diagram illustrating a surface-mount crystal oscillator obtained by assembling the metal cover, the mounted resonator, and the base board of FIG. 9.
Figure 11A:
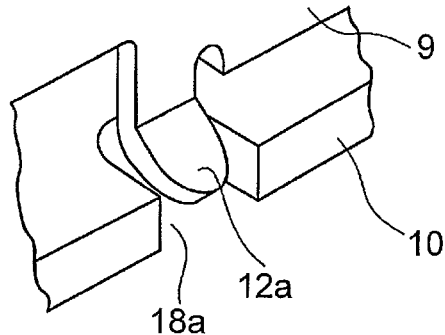
Figure 11B:
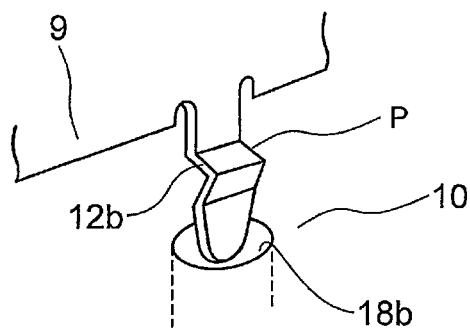
Figure 11C:
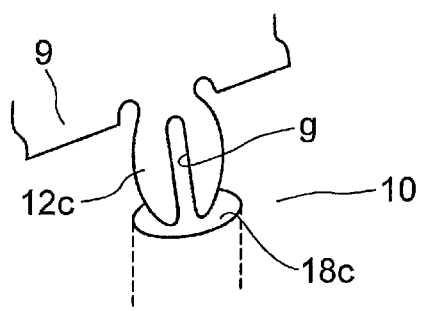

As shown in enlarged views of FIGS. 8A and 8B, a protruding stop portion "e" is formed in a part of the side surface 2d of the cover 2 by further slightly rotating the cover 2 after insertion of the cover claw 8 to the positioning hole 5. By virtue of the elasticity of the stop portion "e", it is possible to prevent the cover 2 and the printed board 1 from slipping.

Figure 4:
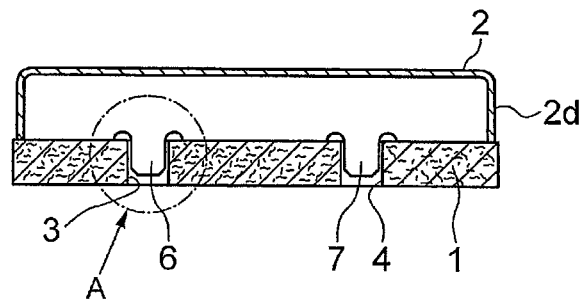
FIG. 4 is a horizontal cross-sectional view illustrating the electronic device configured by securing the cover of FIG. 3 to the printed board as seen from the arrow direction IV-IV of FIG. 3.
Figure 5:
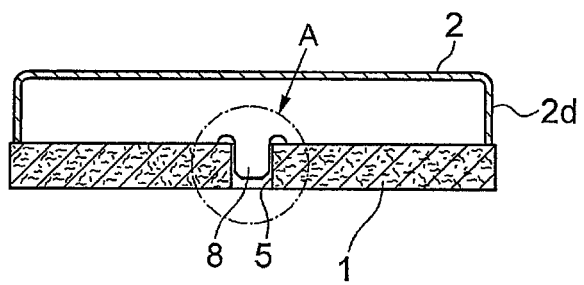
FIG. 5 is a horizontal cross-sectional view illustrating the electronic device of FIG. 3 as seen from the arrow direction V-V of FIG. 3.
Figure 6:
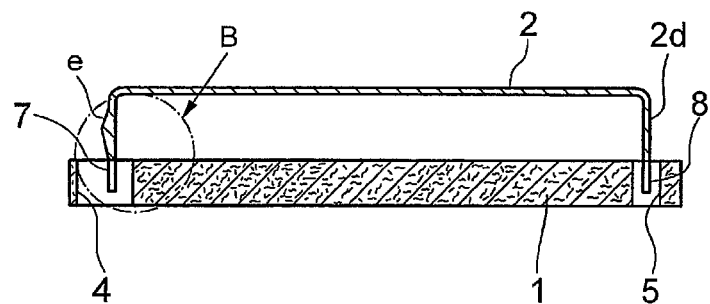
FIG. 6 is a vertical cross-sectional view illustrating the electronic device of FIG. 3 as seen from the arrow direction VI-VI of FIG. 3.

Out of the positioning holes 3, 4, and 5 formed in the printed board 1, the positioning holes 3 and 4 in the first end surface 1a side of FIG. 4 can be reverse-tapered toward the bottom face of the printed board, and the side surfaces of the claws 6 and 7 inserted into the positioning holes 3 and 4 may have an acute angle to match the reverse-tapered shape with respect to the principal surface of the printed board 1 to retain the claws 6 and 7 therein.

What is claimed is:

1. An electronic device, comprising:
   a positioning hole formed in a predetermined position of a printed board; and
   a cover that has a cover claw fitted to the positioning hole and covers a principal surface of the printed board,
   wherein at least two positioning holes are formed in the vicinity of a first end surface of the printed board,
   at least one positioning hole is formed in the vicinity of a second end surface of the printed board,
   one of at least the two positioning holes formed in the vicinity of the first end surface is deviated by a predetermined dimension in parallel along a vertical center line with respect to the first end surface,
   at least two cover claws are formed in parallel with a first end surface of the cover,
   at least one cover claw is formed in a center position of the second end surface of the cover,
   at least the two cover claws are fitted to the corresponding positioning holes formed in the first end surface of the printed board, and
   the cover claw formed in the second end surface of the cover is fitted to the positioning hole formed in the vicinity of the second end surface of the printed board by twisting the cover, so that the cover is firmly secured to the printed board.

2. The electronic device according to claim 1, wherein a shape of the positioning hole formed in the first end surface of the printed board is a circle shape as seen in a plan view, and
   a shape of the positioning hole formed in the second end surface of the printed board is an elliptical shape as seen in a plan view.

3. The electronic device according to claim 1, wherein, in a side surface of the cover positioned to match at least the two positioning holes formed in the vicinity of the first end surface of the printed board, the cover is fitted to the positioning hole formed in the vicinity of the first end surface of the printed board and then is rotated, and a stop portion is formed in the side surface of the cover by twisting the cover when the cover is fitted to the printed board, so that the fitted cover claw is prevented slipping from at least two positioning holes.

4. The electronic device according to claim 1, wherein at least the two positioning holes are formed in a reverse-tapered shape toward a bottom face of the printed board, and
   a side surface of at least the two cover claws have an acute angle with respect to a principal surface of the printed board.

5. The electronic device according to claim 1, wherein a constricted portion is formed in an elementary part of at least the two cover claws adjoining the printed board.

* * * * *